United States Patent [19]

Williams et al.

[11] Patent Number: 5,045,408

[45] Date of Patent: Sep. 3, 1991

[54] THERMODYNAMICALLY STABILIZED CONDUCTOR/COMPOUND SEMICONDUCTOR INTERFACES

[75] Inventors: R. Stanley Williams, Panorama City; Jeffrey R. Lince, Los Angeles, both of Calif.

[73] Assignee: University of California, Oakland, Calif.

[21] Appl. No.: 909,461

[22] Filed: Sep. 19, 1986

[51] Int. Cl.$^5$ ............... B32B 15/00; H01L 29/46
[52] U.S. Cl. ............................. 428/620; 428/642; 428/650; 428/929; 357/67
[58] Field of Search ............... 437/184, 187, 192; 357/67 R, 65; 428/620, 929, 641, 642, 650; 200/265, 266, 267-269

[56] References Cited

U.S. PATENT DOCUMENTS

| | | | |
|---|---|---|---|
| 2,798,989 | 7/1957 | Welker | 437/184 |
| 3,046,651 | 7/1962 | Olman et al. | 29/498 |
| 3,099,558 | 7/1963 | New et al. | 148/1.5 |
| 3,122,460 | 2/1964 | Sato et al. | 148/185 |
| 3,152,323 | 10/1964 | Einthoven et al. | 22/224 |
| 3,210,222 | 10/1965 | Diedrich et al. | 148/33 |
| 3,224,876 | 12/1965 | Frederick | 75/166 |
| 3,235,419 | 2/1966 | Beale et al. | 148/178 |
| 3,245,847 | 4/1966 | Pizzarello | 148/177 |
| 3,264,148 | 8/1966 | Oda | 148/177 |
| 3,401,316 | 9/1968 | Tanaka | 357/67 |
| 3,447,976 | 6/1969 | Faust et al. | 148/1.5 |
| 3,520,735 | 7/1970 | Kunata | 148/1.5 |
| 3,753,804 | 8/1973 | Titburg et al. | 357/67 |
| 3,858,306 | 1/1975 | Klock et al. | 29/572 |
| 4,471,005 | 9/1984 | Cheng et al. | 357/67 |
| 4,526,624 | 7/1985 | Tombrello et al. | 437/184 |
| 4,564,720 | 1/1986 | Hogan | 357/65 |
| 4,583,110 | 4/1986 | Jackson | 357/65 |
| 4,613,890 | 9/1986 | Scsairer | 357/67 R |

FOREIGN PATENT DOCUMENTS

| | | | |
|---|---|---|---|
| 152481 | 11/1979 | Japan | 357/67 R |
| 130966 | 10/1981 | Japan | 357/67 R |

OTHER PUBLICATIONS

E. Kuphal, "Low Resistance Ohmic Contacts to n-and p-InP", Solid State Electronics, vol. 24, pp. 69-78, 1982.

"Thermodynamically Stable Metal/III-V Compound-Semiconductor Interfaces", R. Stanley Williams, Jeffrey R. Lince, Thomas C. Tsai, and John H. Pugh, Mat. Res. Soc. Symp Proc., vol. 54, 1986, Materials Research Society.

"Comparison of Chemically Inert and Reactive Metal-Compound-Semiconductor Interfaces: AuGa$_2$ and Gold on GaSb(001)", Jeffrey R. Lince and R. Stanley Williams, *Thin Solid Films*, 137 (1986), pp. 251-265.

"The Chemistry of Metal/Compound-Semiconductor Contacts", R. Stanley Williams, The Proceedings of the International Conference on Semiconductor and Integrated Circuit Technology (1986), pp. 282-284.

"The Growth of AuGa$_2$ Thin Films of GaAs(001) to Form Chemically Unreactive Interfaces", Jeffrey R. Lince, C. Thomas Tsai, and R. Stanley Williams, *J. Mater. Res.*, 1(4), Jul./Aug., 1986, pp. 537-542.

"Solid Phase Equilibria in the Au-Ga-As, Au-Ga-Sb, Au-In-As, and Au-In-Sb Ternaries", C. Thomas Tsai and R. Stanley Williams, *J. Mater. Res.*, 1(2), Mar.-/Apr., 1986, pp. 352-360.

"Entropy-Driven Loss of Gas Phase Group V Species from Gold/III-V Compound Semiconductor Systems", John H. Pugh and R. Stanley Williams, *J. Mater. Res.*, 1(2), Mar./Apr., 1986, pp. 343-351.

"AuGa$_2$ on GaSb(001): An Epitaxial, Thermodynamically Stabilized Metal/III-V Compound Semiconductor Interface", Jeffrey R. Lince and R. Stanley Williams, *J. Vac. Sci. Technol.*, B3(4), Jul./Aug., 1985, pp. 1217-1220.

*Primary Examiner*—John J. Zimmerman
*Attorney, Agent, or Firm*—R. Stanley Williams; Jeffrey R. Lince

[57] ABSTRACT

A method of utilizing bulk phase diagrams to design thermodynamically stable conductor/component semiconductor compound-semiconductor interfaces. The ternary phase diagrams are examined to determine pseudobinary tielines between the compound semiconductor and conducting intermetallic compounds. The phase diagrams also allow prediction of the most stable interface. The resulting interfaces are not only thermally stable, but chemically and electrically uniform.

5 Claims, 16 Drawing Sheets

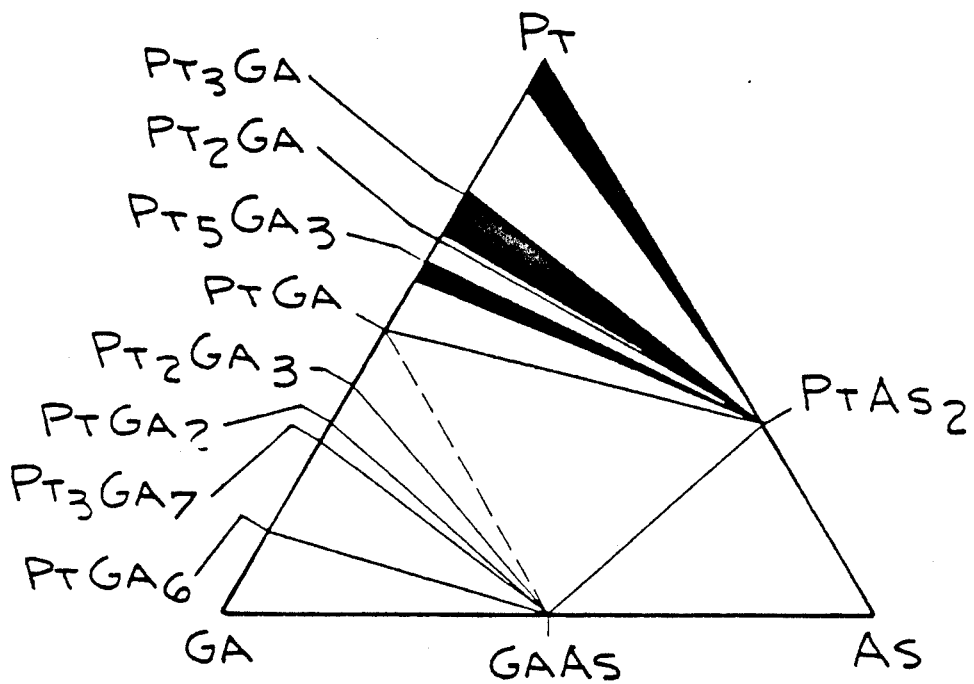
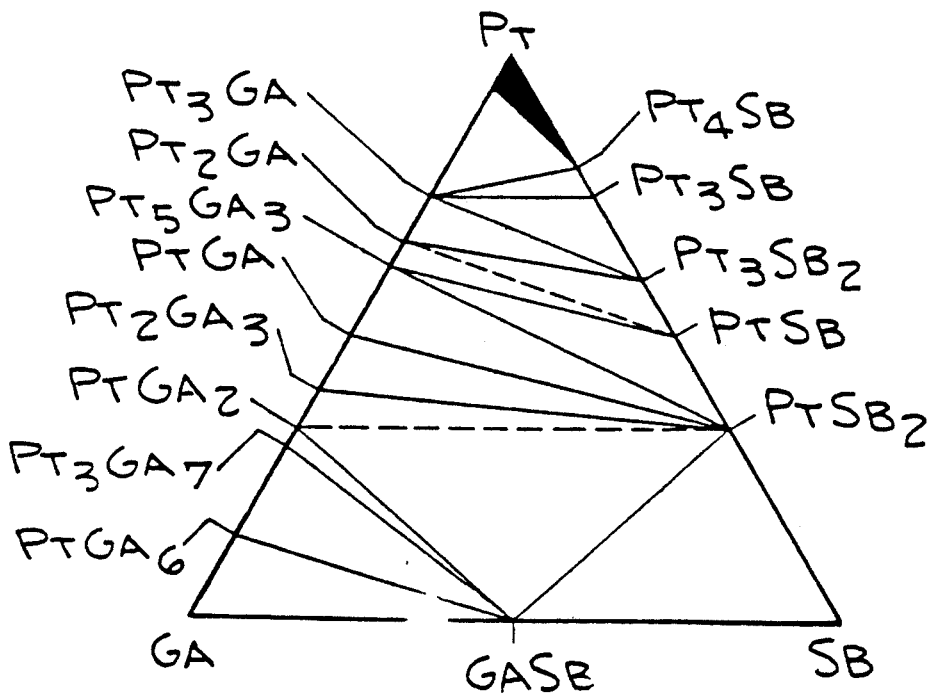
Fig. 5.

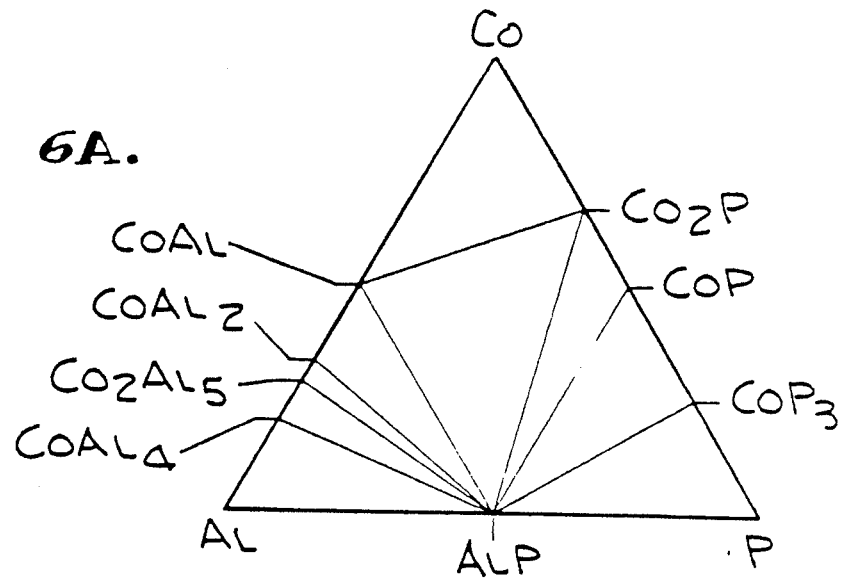
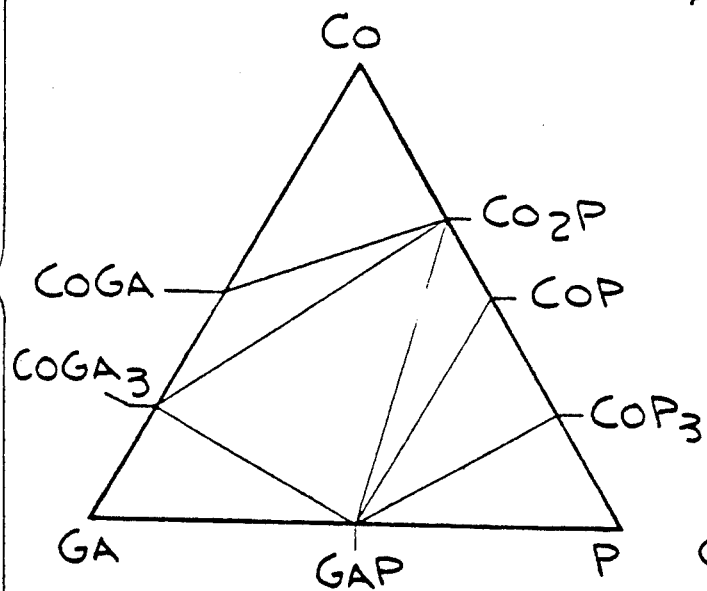
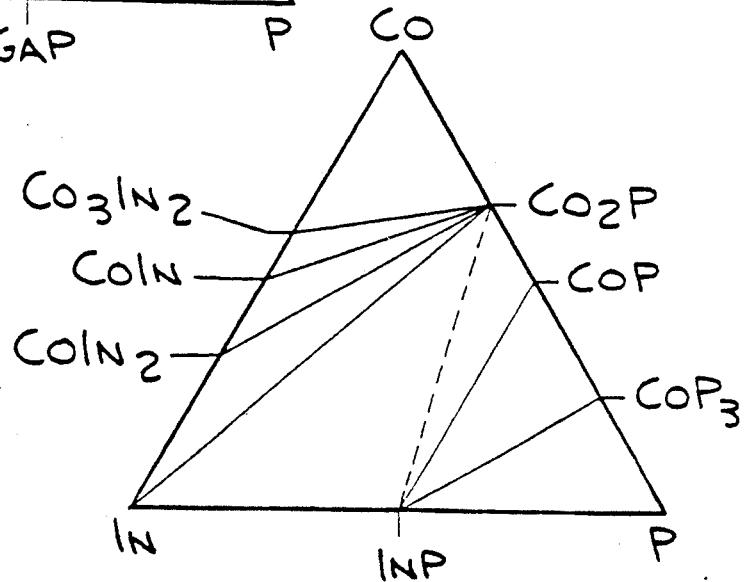
Fig. 6A.

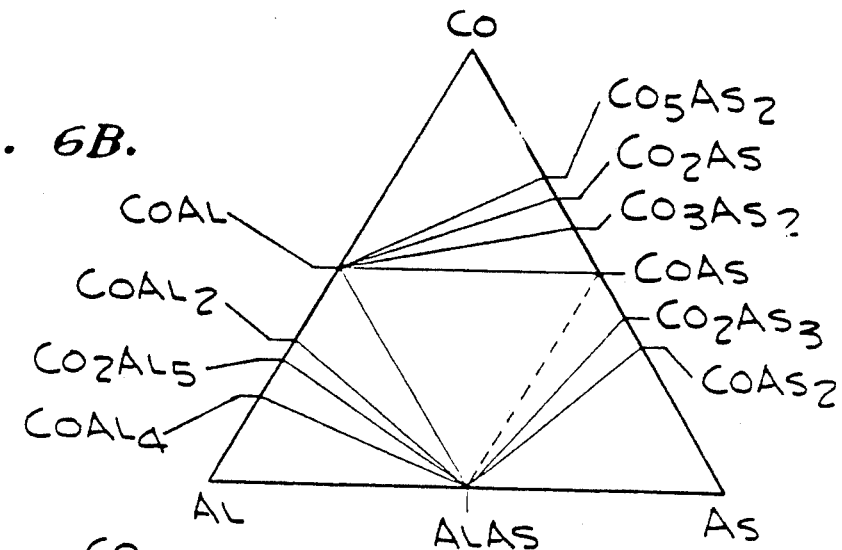
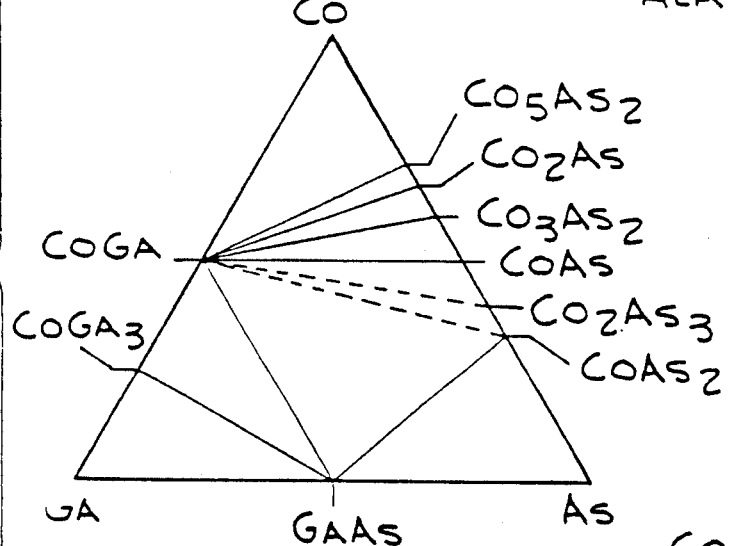
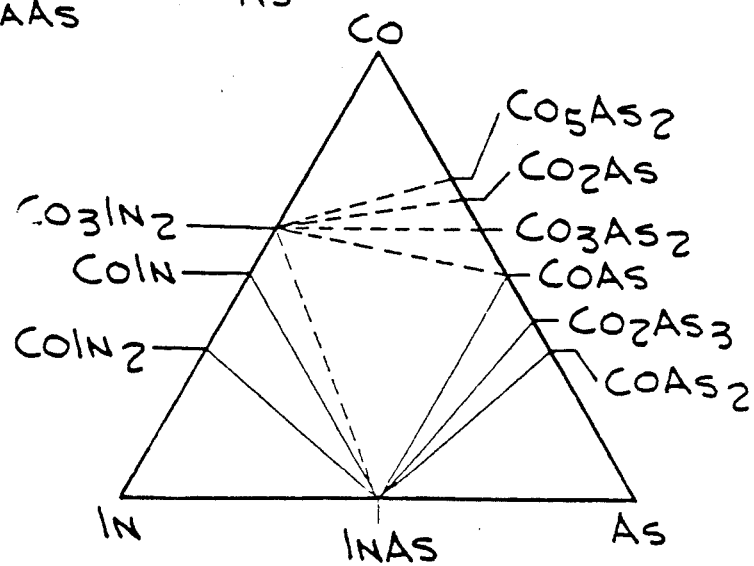
Fig. 6B.

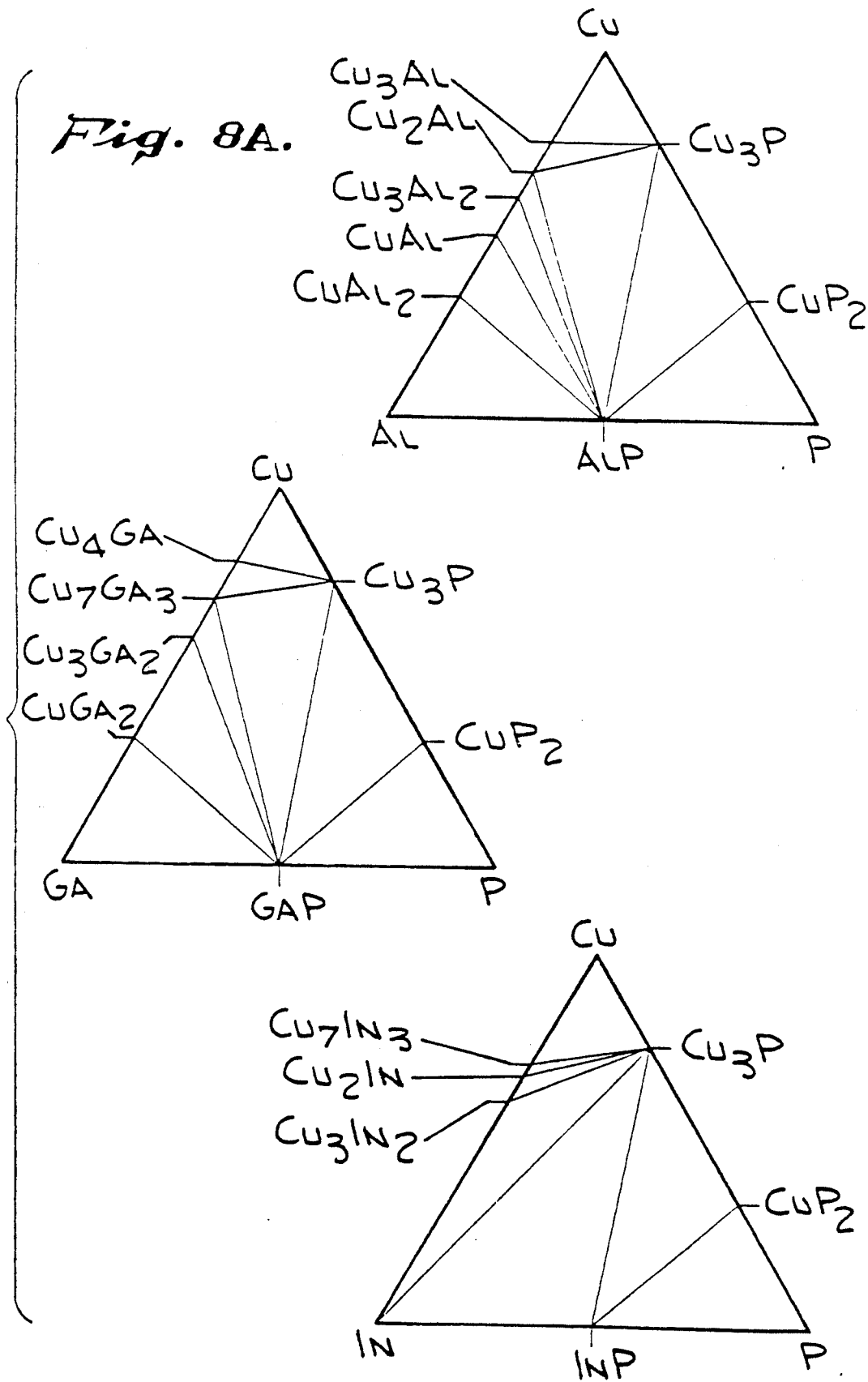

Fig. 8C.
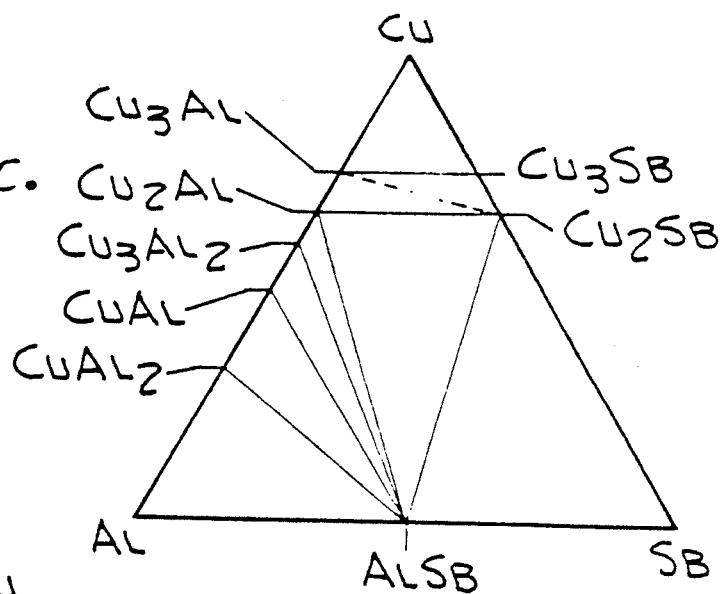
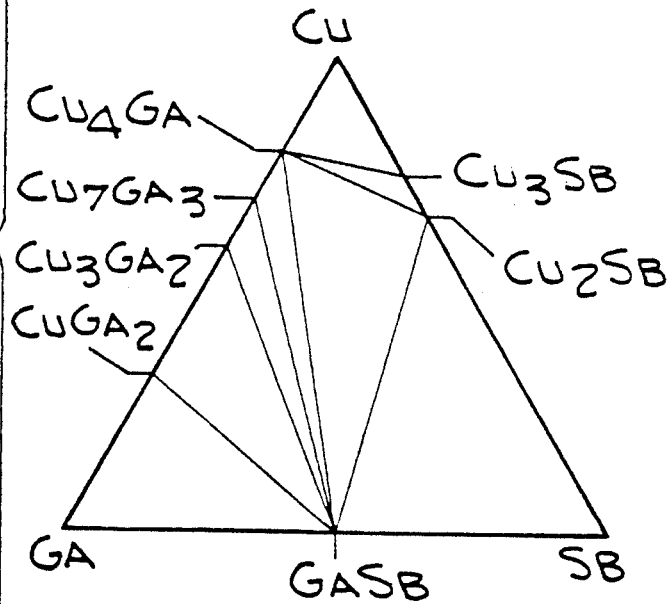
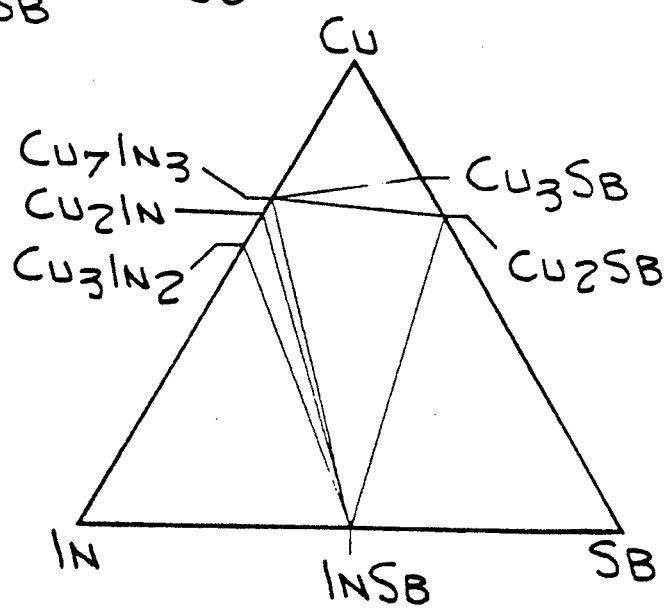

THERMODYNAMICALLY STABILIZED CONDUCTOR/COMPOUND SEMICONDUCTOR INTERFACES

This invention was made with Government support under ONR Contract N00014-83-K-0612. The Government has certain rights in this invention.

FIELD OF THE INVENTION

The present invention relates in general to semiconductors and in particular to compound semiconductor/conductor interfaces.

BACKGROUND OF THE INVENTION

Solid state chemistry plays a major role in modern electronic-device technology, since the production of device components requires the preparation and manipulation of high-purity conductors, semiconductors, and insulators. New materials and techniques often lead to the development of new and improved devices, and the increasingly sophisticated requirements of the electronics industry provide a focus for research in solid state chemistry. A particular area that has provoked considerable interest recently is the conductor/semiconductor interface. Since electronic devices must communicate with one another and with the outside world via conducting contacts, the optimization of circuitry will require a high degree of chemical control over metallizations on semiconductors.

Presently, however, the typical Ohmic contact or Schottky barrier is produced by depositing some portion of the periodic table onto a device structure and annealing the result. Which portion of the periodic table is used as the contact metal and the details of the forming procedure are determined empirically by screening the metallizations for desirable electronic properties, such as Schottky barrier heights or contact resistance. Compared to the control and care exercised during the production of the semiconductor portion of the device, contact metallization is still in a primitive stage of development.

Conducting contacts to compound semiconductors are a particular problem. When an elemental metal is deposited onto a binary compound semiconductor substrate, a solid ternary system is formed. In general, the metal-semiconductor system will not be in thermodynamic equilibrium, and a chemical reaction will take place that involves the three elements of the system. The phase rule predicts that, for an arbitrary pressure and temperature, there may be as many as three different solid phases in equilibrium with one another in a ternary system. To appreciate why this fact is a cause for concern, one should consider the nature of the contact metallization after a reaction has occurred at the metal/semiconductor interface.

Early in the reaction sequence, the metal may form Q different compounds or alloys with each of the elements of the compound semiconductor. Even if the annealing process proceeds to a state of chemical equilibrium between the overlayer and the substrate, the chances are good that the resulting overlayer will be comprised of two different phases. Such a conducting film will be very heterogeneous, since the chemical and electrical properties of the two phases will most likely be very different, and controlling the morphology of the film will be extremely difficult. A schematic view of such a contact is shown in FIG. 1. In FIG. 1 the ideal contact is a uniform conducting phase. In practice, alloyed or sintered contacts on compound semiconductors are composed of at least two phases. The interface morphology is rough, and voids are often present. The film is extremely non-uniform and often breaks open. The semiconductor material under such a contact contains a large number of defects.

This situation contrasts with that for elemental semiconductors such as Si onto which a single-element containing metal has been deposited. Since a binary system will have at most two solid phases at equilibrium, the metal contact of an elemental semiconductor in thermodynamic equilibrium will be comprised of only one phase, either the unreacted metal or a compound such as a silicide. Thus, contact technology for compound semiconductors is in principle more troublesome than that for elemental semiconductors because of the extra degree of freedom introduced into the phase diagram of the metal/semiconductor system by the presence of an "extra" element.

There are other reasons to be concerned about the chemical reactions in metal/compound-semiconductor systems. Such solid state reactions consume some of the semiconductor material, and may seriously alter the morphology of the substrate material, as well as generate numerous defects in the metal/semiconductor interface region. These defects may later diffuse to active regions of the device, degrade its performance, and shorten its useful life. Another problem is that the system may not have achieved thermodynamic equilibrium during the forming process. If chemical reactions continue to occur after the device is placed in service, perhaps driven by the power dissipated in the device by the flow of current, the nature of the contact, and thus the device properties, will change with time. All of the above possibilities are highly undesirable effects, especially for very small devices and for systems that are intended to operate at high temperatures.

Studies have shown that films formed by thermal oxidation processes yield systems that are locally in thermodynamic equilibrium. For the case of GaAs, the film formed in contact with the semiconductor is composed of elemental As and $Ga_2O_3$. After a sufficiently thick layer has grown, another oxide layer may form, containing other phases that are in equilibrium with the first layer. Thus, these oxide films may actually be multilayered structures, with the phases at each interface in local thermodynamic equilibrium. Behavior similar to that of the oxides may Q be expected from metal films, although the metal films are more complex since the metallic phases formed often have appreciable solubility with one another.

The stabilization of interfaces between metals and III-V compound semiconductors is especially desirable (e.g., whether metal=Pt, Ag, Au; III=Al, Ga, In; V=P, AS, Sb) because of the common use of these metals in integrated circuit fabrication.

Studies have described "out-diffusion" of the group III element through the metal overlayer or "interdiffusion" of the metal and compound-semiconductor materials during heat treatment, and have shown that this intermixing of the group-III metal and the overlayer metal is the result of a chemical reaction in which various alloys and intermetallic compounds are formed.

The general pattern that arises from these studies is that heating a metal/III-V system leads to the decomposition of some of the substrate material, with, in the case of Au, the simultaneous formation of Q Au/group-III intermetallic compounds and elemental group V, some of which may escape from the film into the vapor phase. The resulting conducting contact has several undesirable properties, the most obvious of which is a rough film morphology that consists of polycrystalline grains of intermetallic compounds, elemental group V, and the III-V compound-semiconductor material. Such a heterogeneous overlayer is not suitable for defining very small features for microcircuits. Another problem is that the Au-rich intermetallic compounds observed to form are brittle and have a higher resistivity than Au. Finally, defects introduced by such alloying procedures have been shown to affect adversely the lifetime of operating devices.

The occurrence of strong chemical interactions between Au and III-V compound semiconductors has also been observed near room temperature for thin films deposited on atomically clean surfaces In-vacuo photoemission and Auger studies of evaporated thin Au films ($<\text{Å}100°$ A) on GaAs, GaSb, and InP substrates reveal that some group-III and sometimes group-V species appear on the surface of the evaporated film, even for film thicknesses of $>20$ monolayers of Au. These chemical reactions at the Au/III-V semiconductor interface are probably the driving force in creating the defects that have been invoked as the cause of the Fermi-level pinning observed in these systems. Furthermore, these reactions generate elemental group-V species, which may be responsible in part for the "common anion rule" of Schottky-barrier formation on III-V compound semiconductors.

The formation of Au-Ga intermetallic compounds and As from Au films on GaAs may be understood in terms of simple thermodynamics. In a closed system, i.e., one in which no gas phase species are allowed to form, there is no detectable bulk reaction between Au and GaAs. This means that in the Au-Ga-As ternary phase diagram, Au and GaAs are connected by a tieline, and are in thermodynamic equilibrium with one another. This situation is actually fairly rare. For Au and InP or Pt on GaAs, bulk chemical reactions will occur even in closed systems to form intermetallic compounds.

For open systems, i.e., for contacts that are annealed in vacuum chambers and/or operated in ambient atmospheres, there is an additional driving force for the reaction between Au and GaAs, the free energy involved in the evaporation of As$_4$ or As$_2$ from the film. For this case, the energetics of the reaction may be illustrated with a particular example: the reaction of Au with GaAs to form AuGa and gaseous As$_4$:

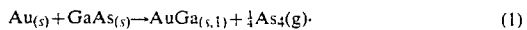  (1)

FIG. 2 shows the change in Gibbs free energy ($\Delta G_R$) of reaction (1) as a function of temperature, as well as the $\Delta G_R$'s for

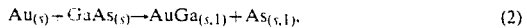  (2)

and

  (3)

The Gibbs free energies plotted in this fashion were taken from the literature for the free energy of formation of GaAs and estimated using the enthalpy of formation for AuGa. Eq. (1) is plotted assuming that the vapor pressure of As$_4$ is maintained at $10^{-8}$ Torr over the sample. The plot in FIG. 2 indicates that, at temperatures over $\sim 500$ K, the overall reaction in Eq. (1) will proceed in the forward direction until either all the Au or GaAs has reacted. Although the temperature at which $\Delta G_R$ of Eq. (1) becomes negative is only an estimate, because of the uncertainties in the quantities used to derive the plot in FIG. 2, the primary point of interest is that depositing Au on a GaAs surface will lead to a breakdown of GaAs and evolution of As$_4$ at a significantly lower temperature than that observed for the non-congruent sublimation of As$_4$ from clean GaAs. Thus, when depositing Au on GaAs and annealing the resultant system in a large-volume container to temperatures $\sim 500$ C, one would expect the Au to react with GaAs to form one or more Au-Ga intermetallic compounds with the subsequent release of As$_4$(g) On the phase diagram, the system would become increasingly As-deficient, and the equilibrium state would depend upon the total amounts of Au, Ga, and As present after the reaction reached completion This result is obviously undesirable.

Accordingly, it is the principal object of the present invention to thermodynamically stabilize a conductor/compound semiconductor interface.

It is a further object of this invention to provide a stable interface between an intermetallic compound and a compound semiconductor.

SUMMARY OF THE INVENTION

The present invention, in a broad aspect, is a method of forming a thermodynamically stable contact between a conductor and a compound semiconductor through the use of ternary phase diagrams. A ternary phase diagram of the elements forming the conductor and compound semiconductor is examined to determine pseudobinary tielines between the compound semiconductor and various intermetallic compounds. The tielines define thermodynamically stable interfaces where the compound semiconductor behaves as a binary system with the intermetallic compound.

In accordance with one feature of the invention, a method of forming an optimum thermodynamically-stabilized contact between a conductor and a III-V compound semiconductor utilizes the intermetallic compounds which are connected to the compound semiconductor by tie-lines through the ternary phase diagram.

In accordance with another feature of the present invention, novel products, i.e., specific intermetallic compounds, are formed by the processes of the methods of the present invention.

Other objects, features, and advantages of the present invention will become apparent from a consideration of the following Detailed Description and the accompanying drawings

BRIEF DESCRIPTION OF THE DRAWINGS

FIG. 5 are the ternary phase diagrams for Pt-Ga-As and Pt-Ga-Sb as utilized according to the present invention;

DETAILED DESCRIPTION

Figure 1:
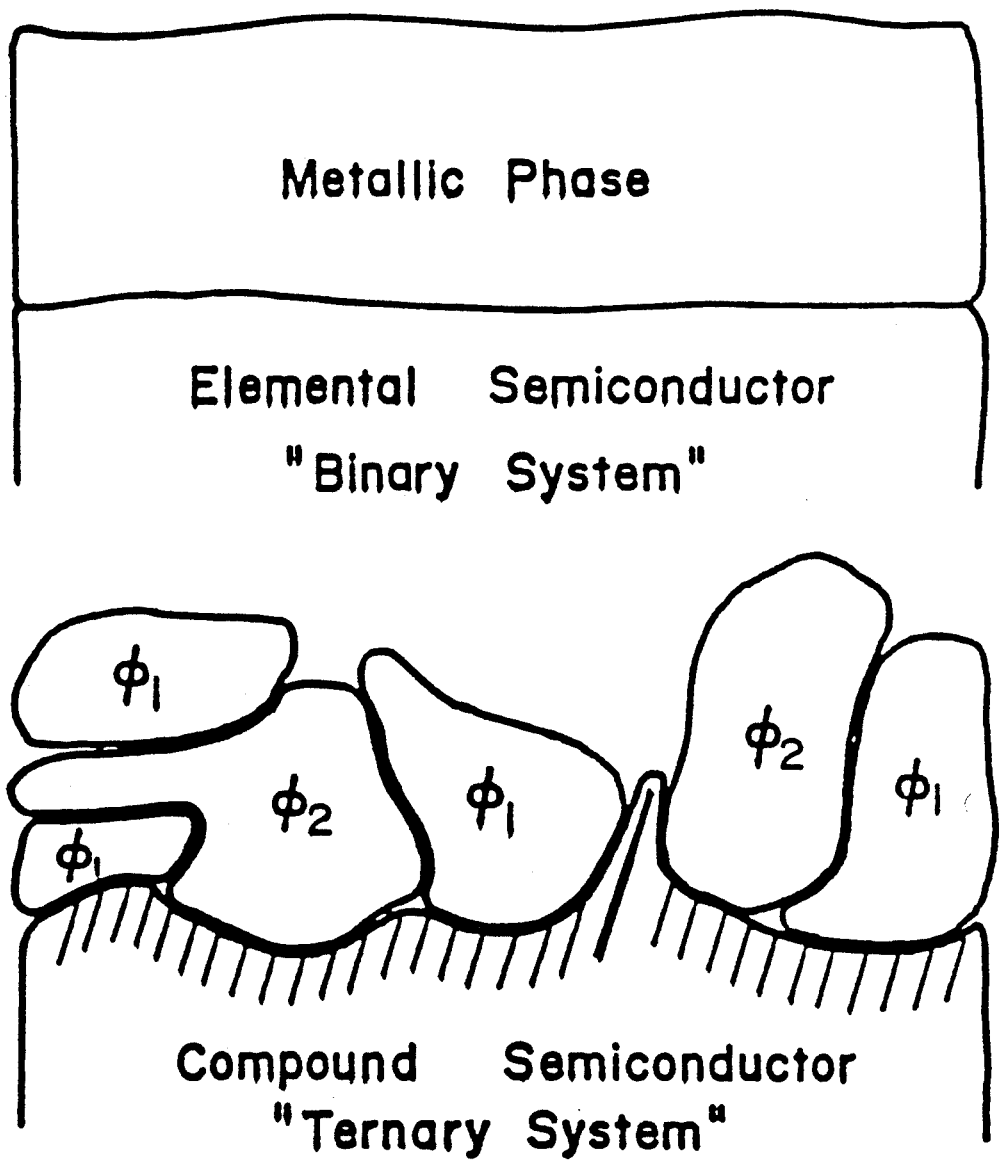
FIG. 1 is a schematic drawing of conducting thin-films on semiconductor substrates.
Figure 2:
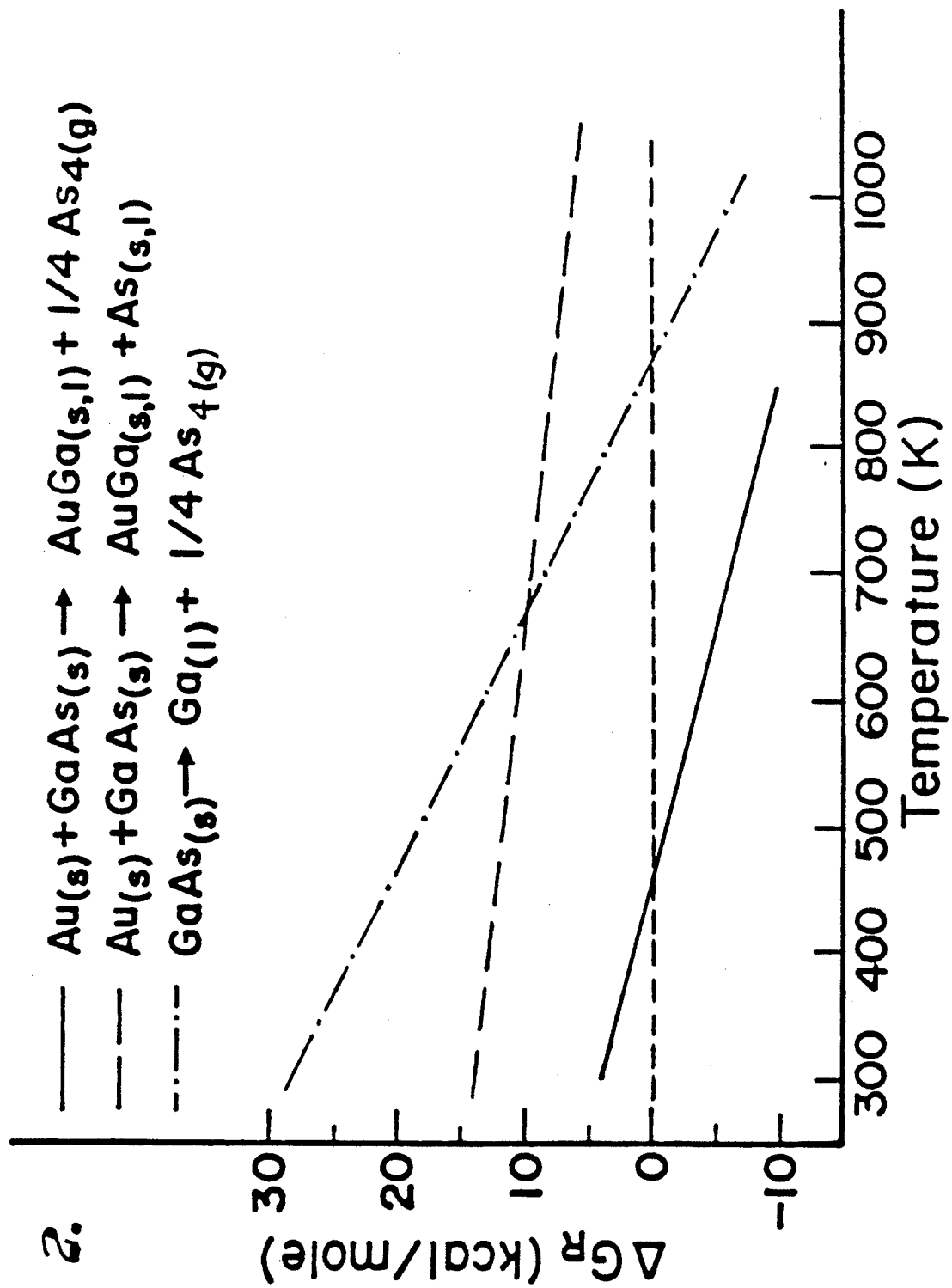
FIG. 2 is a graph of the change in the Gibbs free energies ($\Delta G_R$) for reactions 1-3 in the Background as a function of temperature.

Ternary phase diagrams of bulk materials can be used to engineer conductor/compound-semiconductor interfaces that are near thermodynamic equilibrium. The present invention is a method for the use of ternary phase diagram to determine "pseudobinary" tielines between an intermetallic compounds and a compound-semiconductor. The result is a contact in which the conducting film, i.e., the intermetallic compound, the compound semiconductor behave like two elemental species that form a simple (binary) eutectic system.

As applied to III-V compound semiconductors, the present invention is also a method for fabricating a thermodynamically stable conductor/compound-semiconductor junction in which an intermetallic compound containing the group III element present in the compound semiconductor is grown or otherwise placed above the compound semiconductor. The choice of which intermetallic compound is used is determined by which ones are connected to the compound semiconductor by a tie-line through the ternary phase diagram and also have a high metallic conductivity.

The same principle is equally valid for the II-VI and IV-VI compound semiconductors, with the exception that the intermetallic compounds will contain either the group II or VI elements for the former and the group IV or VI elements for the latter semiconductor.

The foregoing approach to stabilization of conductor/compound-semiconductors interfaces is an alternate to that previously employed, which has involved, for example, empirical screening of the properties of the metal/semiconductor contact such as Schottky barrier height. The prior trend has been to look at increasingly thinner metal "films", since the Schottky barrier height appears to be established for submonolayer amounts of metal. In attempting to understand the microstructure of such systems, however, the prior approaches have almost completely ignored the macroscopic chemical properties of the junctions, which are the focus of the present invention.

The knowledge and understanding of the bulk chemistry of these contacts is directly relevant to such topics as the morphology of the interfacial region and the compounds that may be found there; these in turn determine the ability to pattern extremely small features into the metallization and the reliability of a device structure. If a chemical reaction occurs at the contact interface, driven either by an anneal during the forming process or by Ohmic heating during device operation, then the geometry and electrical properties may change drastically in an uncontrollable fashion. Furthermore, establishing the bulk properties of these systems will determine which materials may react with one another and what product species can be formed. With this information as a foundation, one may then examine thin film behavior to determine the relative importance of other macroscopic effects, such as bulk reaction kinetics and diffusion, as well as microscopic phenomena, such as defects and interfacial stresses and strains.

Figure 3:
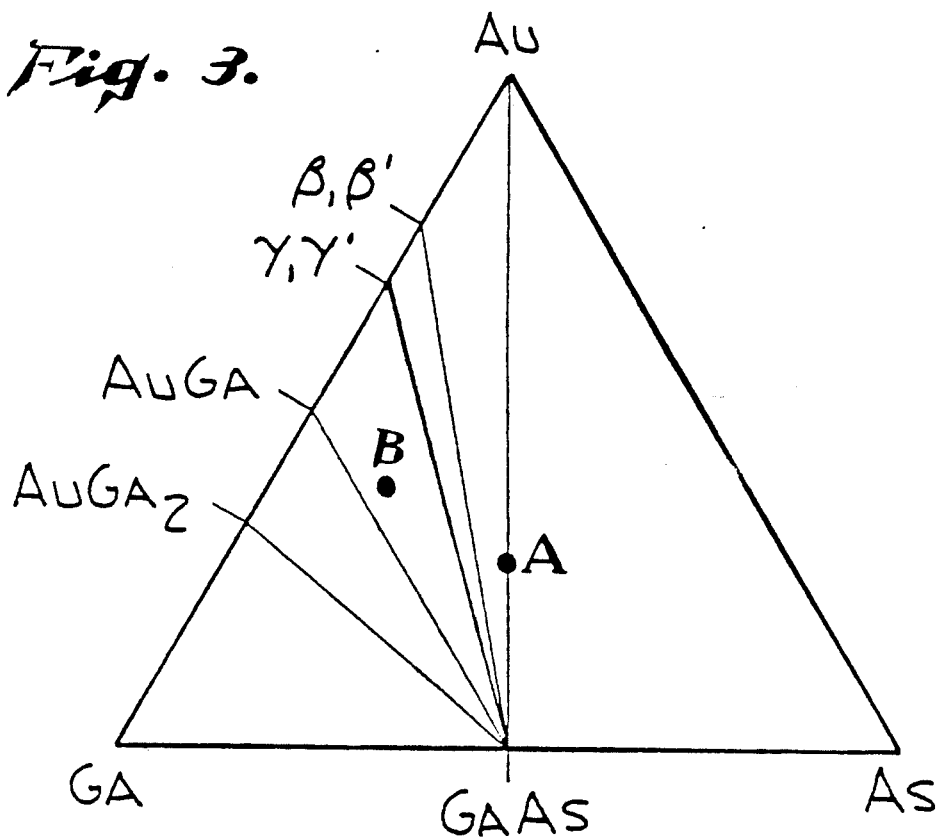
FIG. 3 is the solidus portion of the Au-Ga-As ternary phase diagram as utilized according to the present invention.

The present invention may be understood best by way of an example: the formation of a contact between Au and GaAs. The solidus portion of the Au-Ga-As ternary phase diagram for temperatures from essentially 0K to 650K is shown in FIG. 3. At temperatures above 650K, eutectics form between various compounds and the diagram will look significantly different. As long as the only liquid phase is nearly pure Ga, however, this diagram can be used to determine the relative amounts of different phases present in the system, given the relative amounts of the three elemental components.

Note that the boundaries of the phase diagram are defined by the three elemental components of the system at the vertices of the major equilateral triangle, which is subdivided by several tielines into smaller triangles with vertices determined by the various phases that may exist in the system. Three of those phases are elemental Au, Ga, and As.

This general topology of a ternary phase diagram at a particular temperature and pressure is required by the Gibbs phase rule, $$P = C - f + 2 \qquad (1)$$

i.e., the number of phases (P) in a system is equal to the number of components (C) minus the number of specific degrees of freedom (f) plus 2. If the system is examined at a specific temperature and pressure, say 298K and 1 atm, then $f=2$. Therefore, $P=C$ and at most three phases may co-exist at equilibrium. The relative amounts of each phase are determined first by using the lever rule to locate the elemental composition of the system within the major triangle. Then, the lever rule may be applied again to determine the amounts of the phases that are present. If the composition is specified by a point that lies on a tieline within the Q major triangle, for example, point A in FIG. 3, then there are only two phases, Au and GaAs, in the system at equilibrium. Tielines separate different three-phase regions from one another, and thus represent compositions at which an additional degree of freedom is specified; thus $f=3$ and $P=2$. If, however, the composition is represented by a point such as B in the interior of a minor triangle, then there are three phases at equilibrium (GaAs, AuGa, and $\gamma$). The relative amounts of the phases present are determined by using the lever rule within the subtriangle bounded by GaAs, AuGa, and $\gamma$, for the example of composition B. The arrangement of the tielines in a particular ternary system is determined either experimentally or from existing thermodynamic data.

Thus, the diagram of FIG. 3 predicts that elemental Au and GaAs form a pseudobinary system; that is, these two phases should be stable in contact with one another and do not form any interfacial compounds at any temperature.

Experiments have proven, however, that even though Au and GaAs form a pseudobinary system, chemical reactions occur under normal device processing conditions with subsequent formation of intermetallic compounds of Au and Ga. The explanation for this is as follows The ternary phase diagram in FIG. 3 is implicitly assumed to be a closed system; that is, there is no mass exchange between the system and its surroundings This is true if the system is somehow encapsulated and the external pressure that is applied is greater than the vapor pressure of any volatile species. The environment in which most devices are processed or operated, however, is an open system. Thus, volatile species are either pumped away or escape into the atmosphere, which means that the actual vapor pressure of the group-V species over the solid is extremely small. The change in entropy S accompanying the sublimation of a material at pressure p compared to that at a pressure of 1 atm, the standard reference pressure for most thermodynamic systems, is $$\Delta S = -nR \ln(p), \quad (2)$$

where n is the number of moles that sublime and R is the gas constant.

At a particular temperature, the change in Gibbs free energy for a reaction is $$\Delta G = \Delta H - T\Delta S. \quad (3)$$

Even if H for a reaction involving the sublimation of a species is positive, there will always be some temperature at which the $\Delta G$ becomes negative, since $\Delta S$ for sublimation is positive. The size of the entropic term can be estimated by calculating $T\Delta S$ for the sublimation of one mole of solid at a pressure of $10^{-8}$ Torr and 298K ($T\Delta S \approx nRT \ln(p) \approx 62$ kJ). Thus, for Au films on GaAs heated in vacuo, gas-phase arsenic species have been observed to evolve at temperatures as low as 550 K, as predicted from simple bulk thermodynamic calculations. The entropic contribution to the free energy is large enough to drive the reaction, even though it is endothermic.

The effect of this loss of As is to change the composition of the system. If a thin film of Au is deposited on a GaAs substrate, the resulting system resides on the Au-GaAs tieline, and those are the only two stable phases at the interface. However, if the temperature of the system is raised high enough for a reaction such as

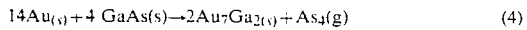

$$14Au_{(s)} + 4 GaAs(s) \rightarrow 2Au_7Ga_{2(s)} + As_4(g) \quad (4)$$

to be driven by the formation of a gas-phase species ($Au_7Ga_2$ is the approximate stoichiometry of the $\beta$ phase), the composition of the system moves to the left on the phase diagram of FIG. 3 and the stable phases are GaAs, Au, and $\beta$, as observed experimentally. If the process is carried out slowly, all the Au will react to form $\beta$ phase. The next reaction will involve $\beta$ and GaAs to form $\gamma$ and $As_4(g)$, followed by $\gamma$ and GaAs to form AuGa and $As_4(g)$, and finally AuGa and GaAs to form $AuGa_2$ and $As_4(g)$. As long as the reactions proceed slowly, there will be at most three solid phased in the system at any given time.

Phase diagrams are also valuable as a predictive

For instance, if one wanted to know what the most stable Au-containing contact to GaAs is, consulting the ternary diagram in FIG. 3 reveals that it is the intermetallic compound $AuGa_2$. This conclusion is trivial, since there are no other Au-containing compounds (other than the liquid Ga phase with small amount of dissolved Au) that could be a product of a reaction of GaAs and $AuGa_2$. Thus, a GaAs substrate with $AuGa_2$ film on it will be stable with respect to any possible chemical reactions until the system is heated above the non-congruent sublimation temperature of GaAs, at which point the GaAs will decompose thermally. The intermetallic compound AuGa will also be significantly more stable than elemental Au although not as stable as $AuGa_2$. Both AuGa and $AuGa_2$ are excellent conductors, and make satisfactory contacts for GaAs.

Since any intermetallic compound containing As will be subject to thermal decomposition for the same reason that GaAs is, one may predict that, for any metallization scheme, the most stable metal in contact with GaAs will be the intermetallic compound that contains the highest percentage of Ga. This observation may also be generalized to all of the III-V compound semiconductors, and is a direct consequence of the Gibbs phase rule and the high volatility of the group-V elements.

Figure 9:
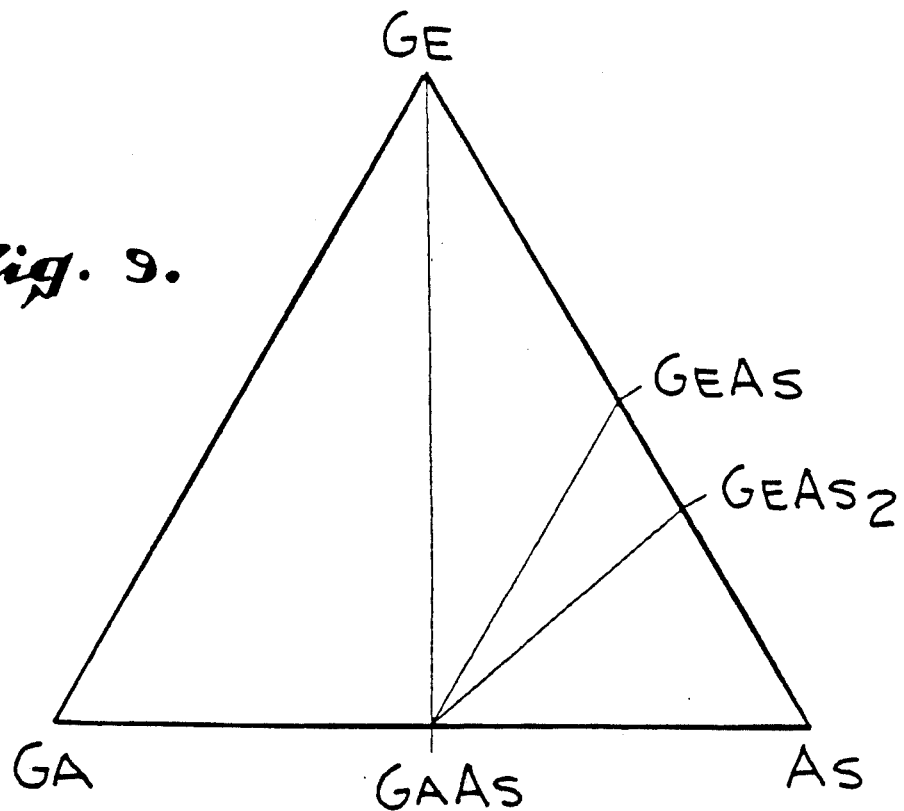
FIG. 9 is the phase diagram for the Ge-Ga-As ternary showing that Ge and GaAs are thermodynamically stable toward one another.
Figure 4A:
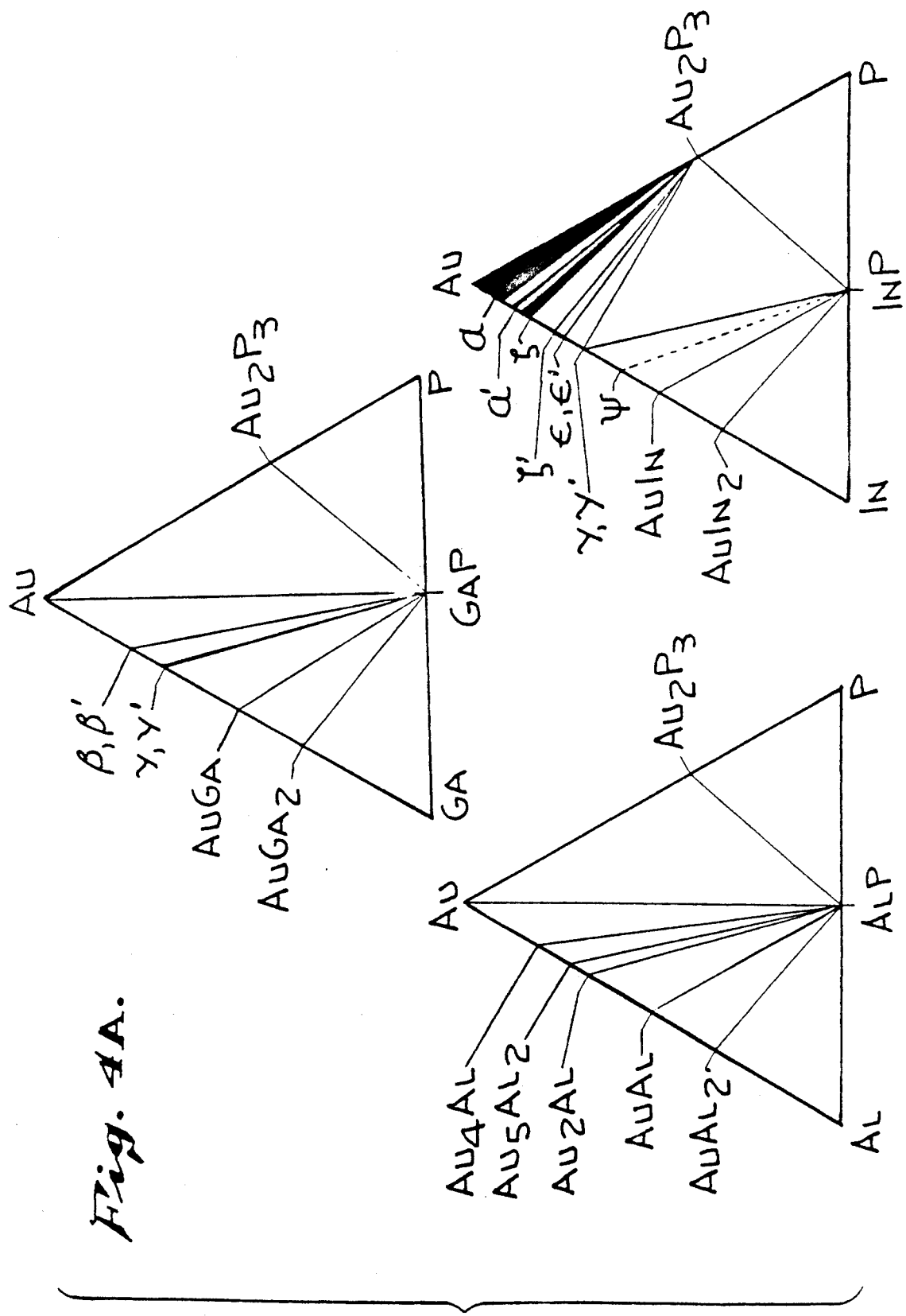
FIG. 4 is the solidus portions of all the ternary phase diagrams of the type Au-III-V as utilized according to the present invention.
Figure 4B:
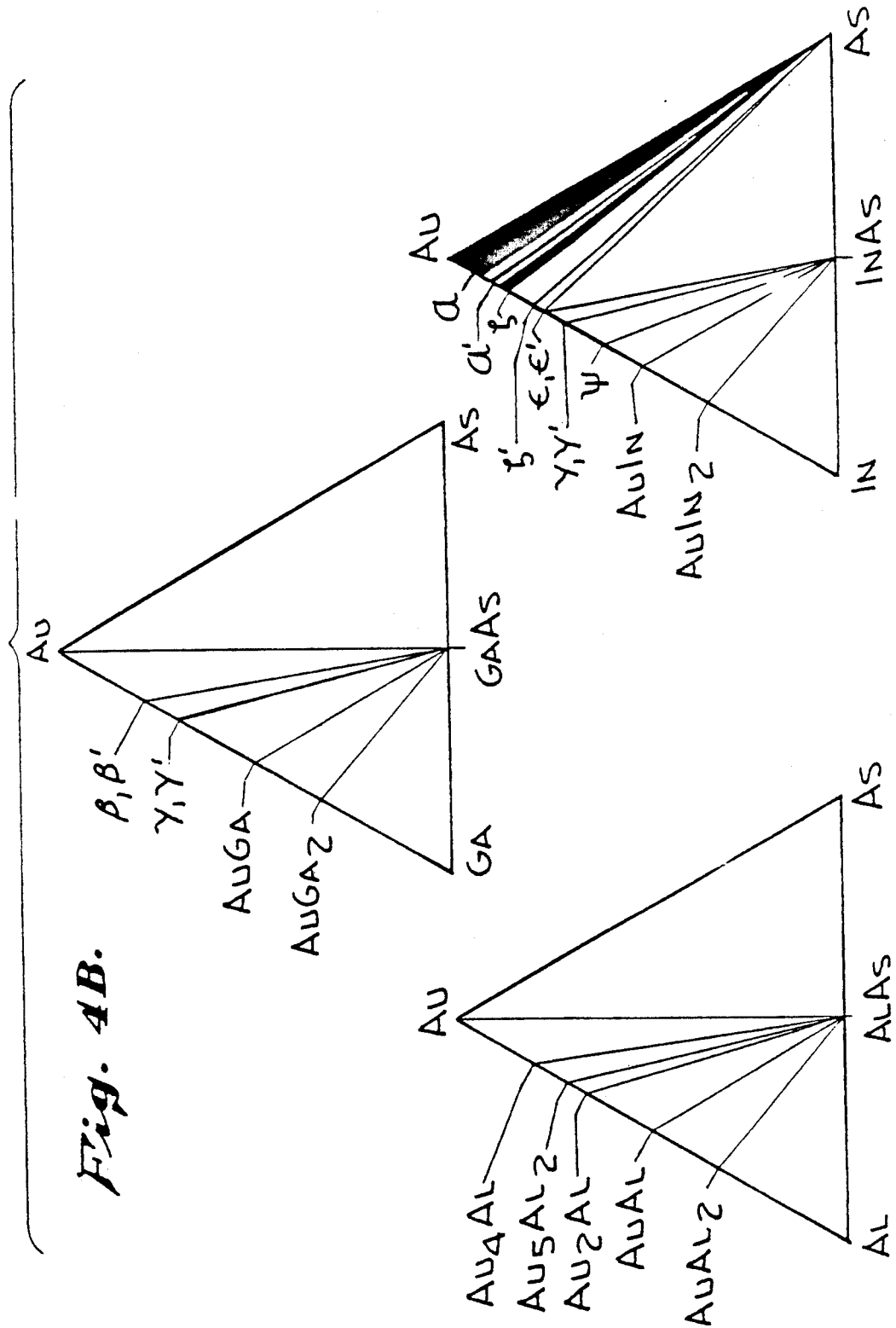
Figure 4C:
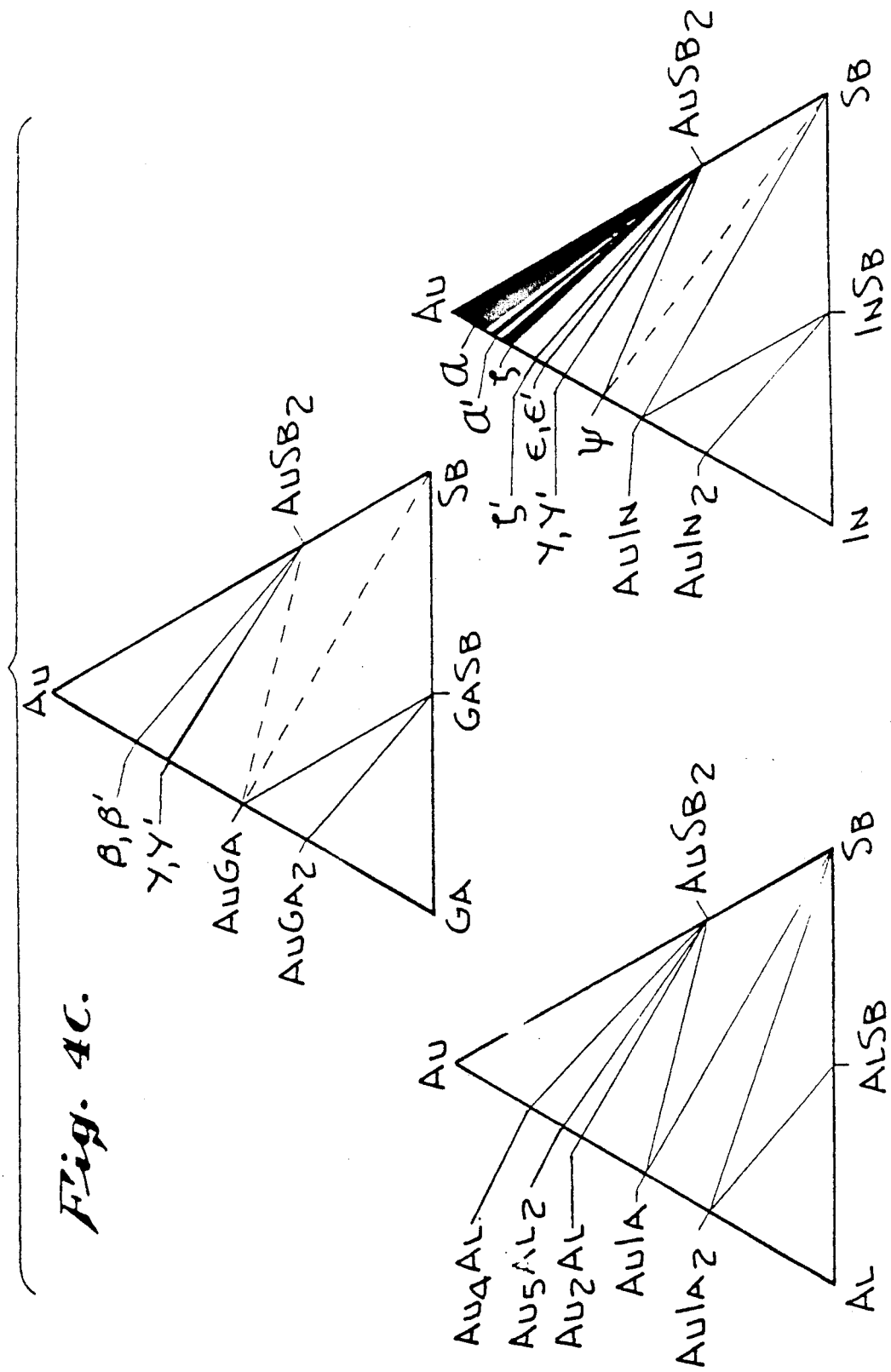
Figure 6C:
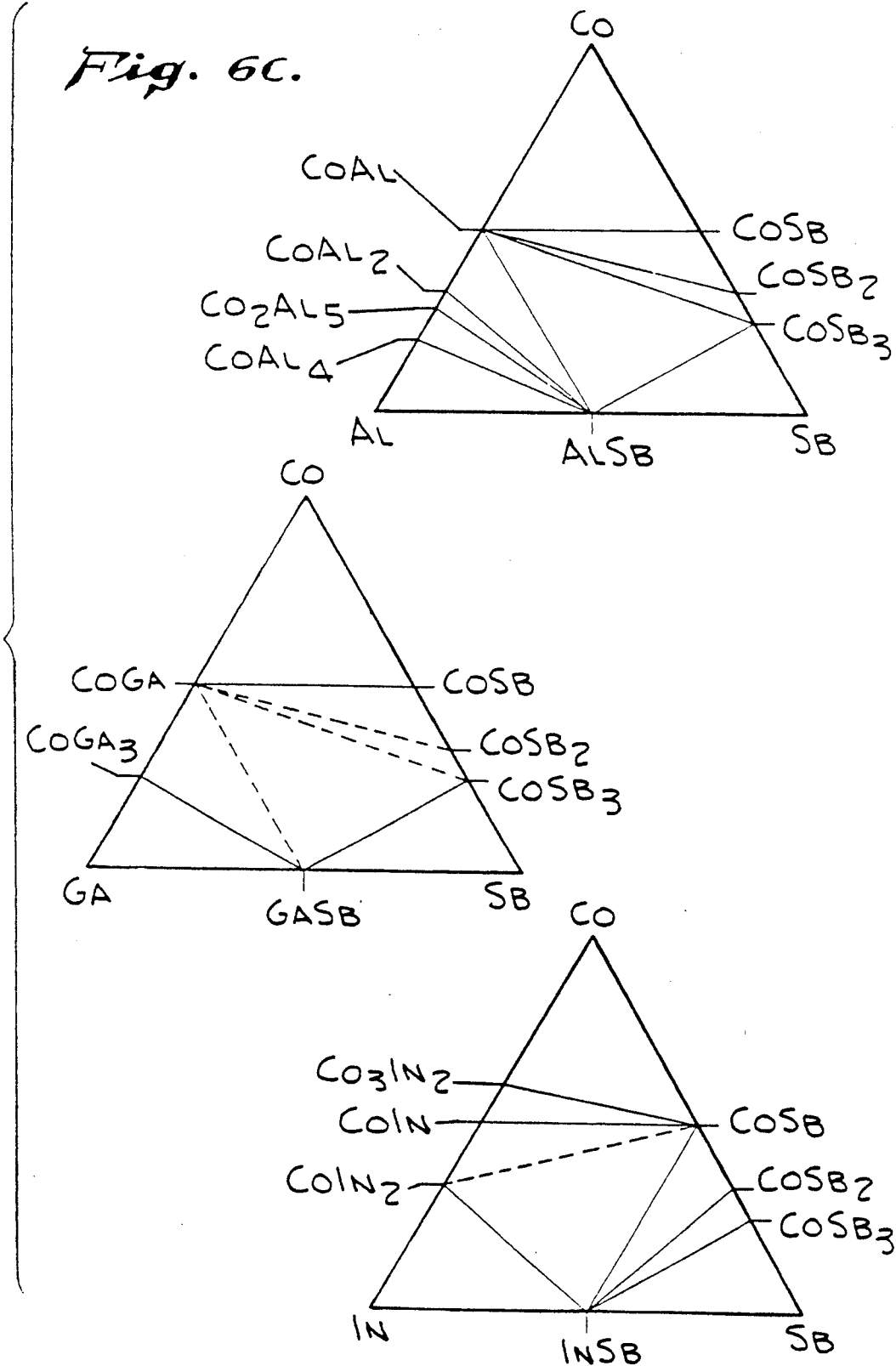
FIG. 6 are the ternary phase diagrams for all Q systems of the type Co-III-V as utilized according to the present invention.
Figure 7A:
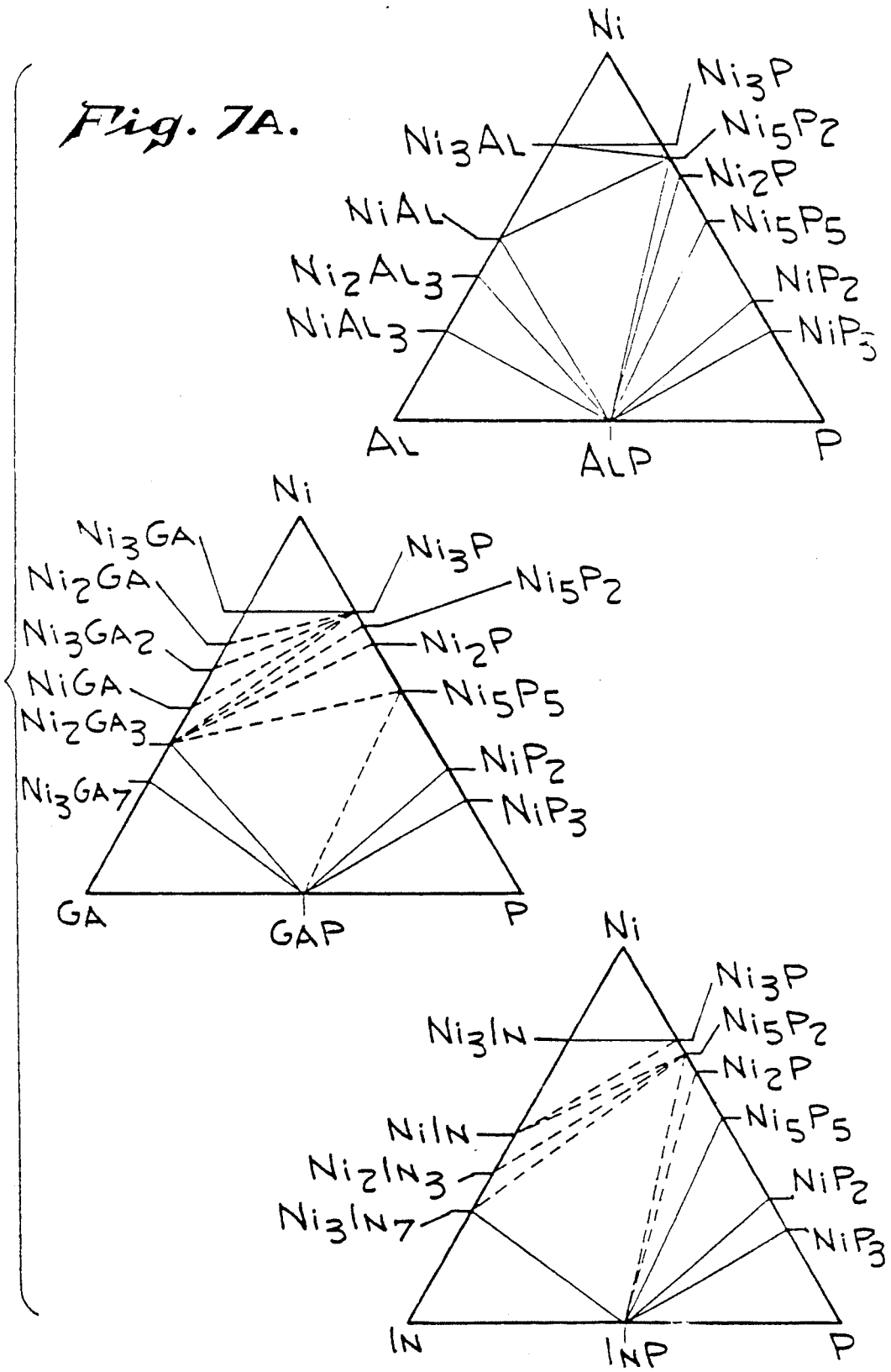
FIG. 7 are all ternary phase diagrams of the type Ni-III-V as utilized according to the present invention.
Figure 7B:
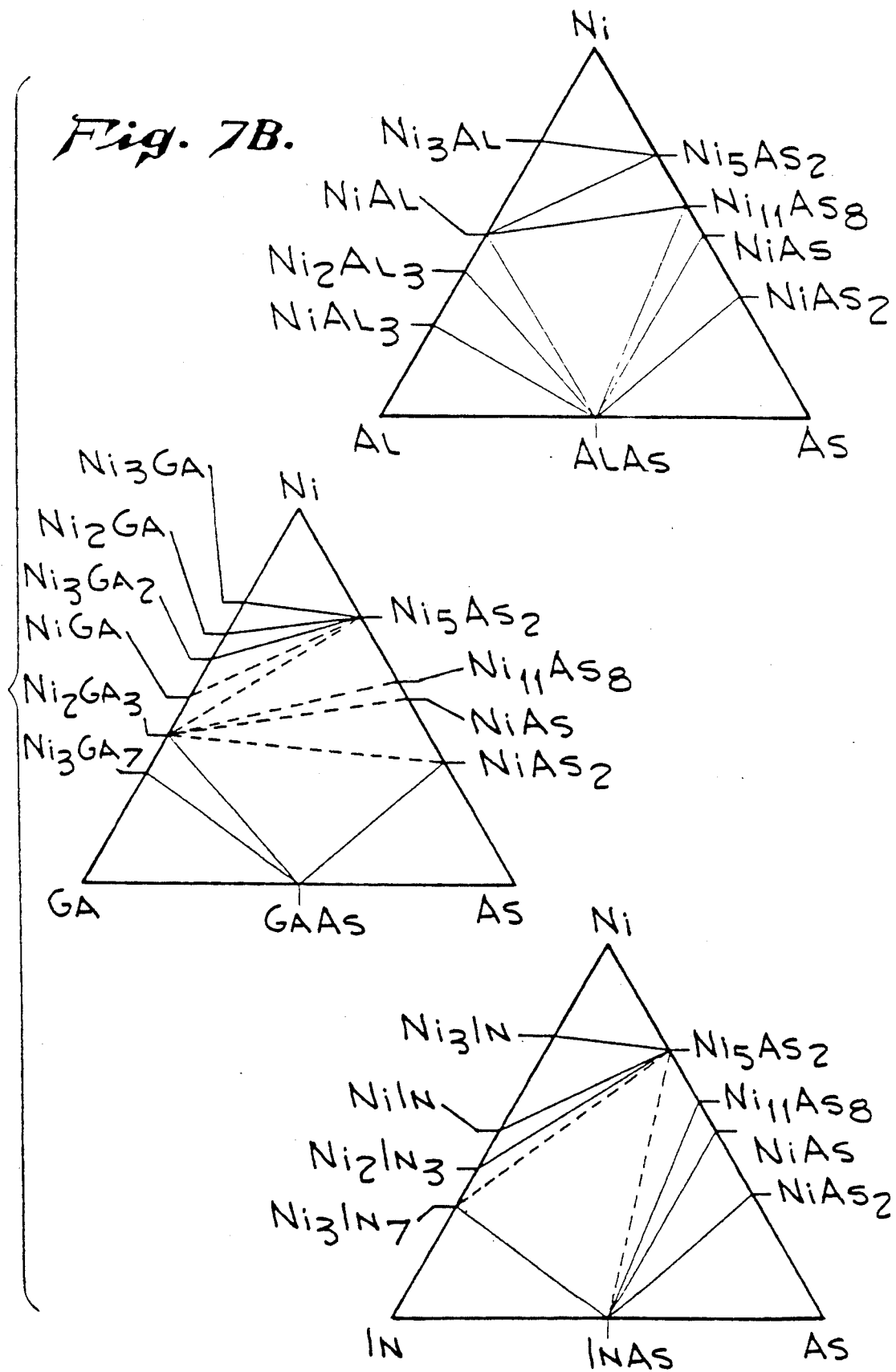
Figure 7C:
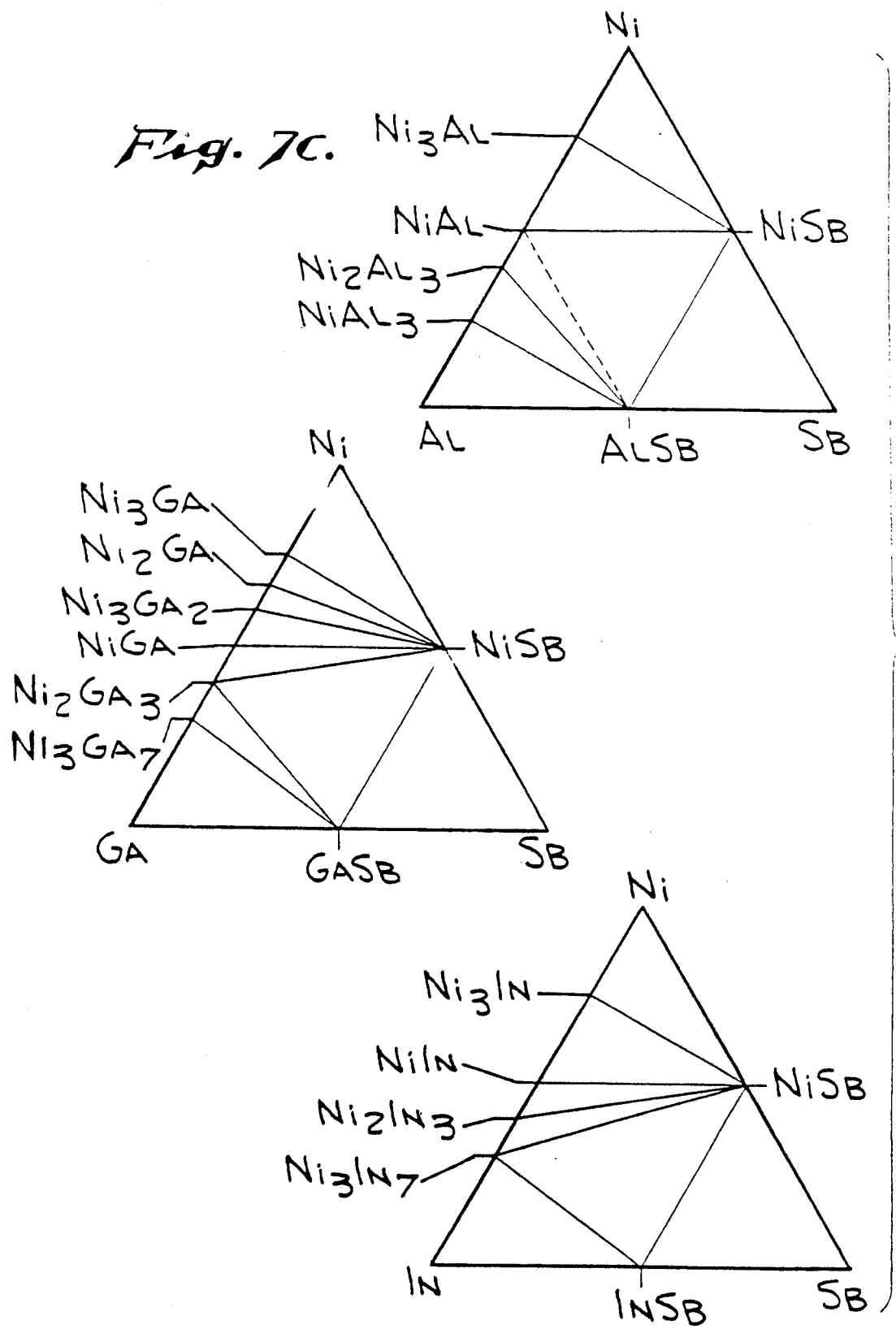
Figure 8B:
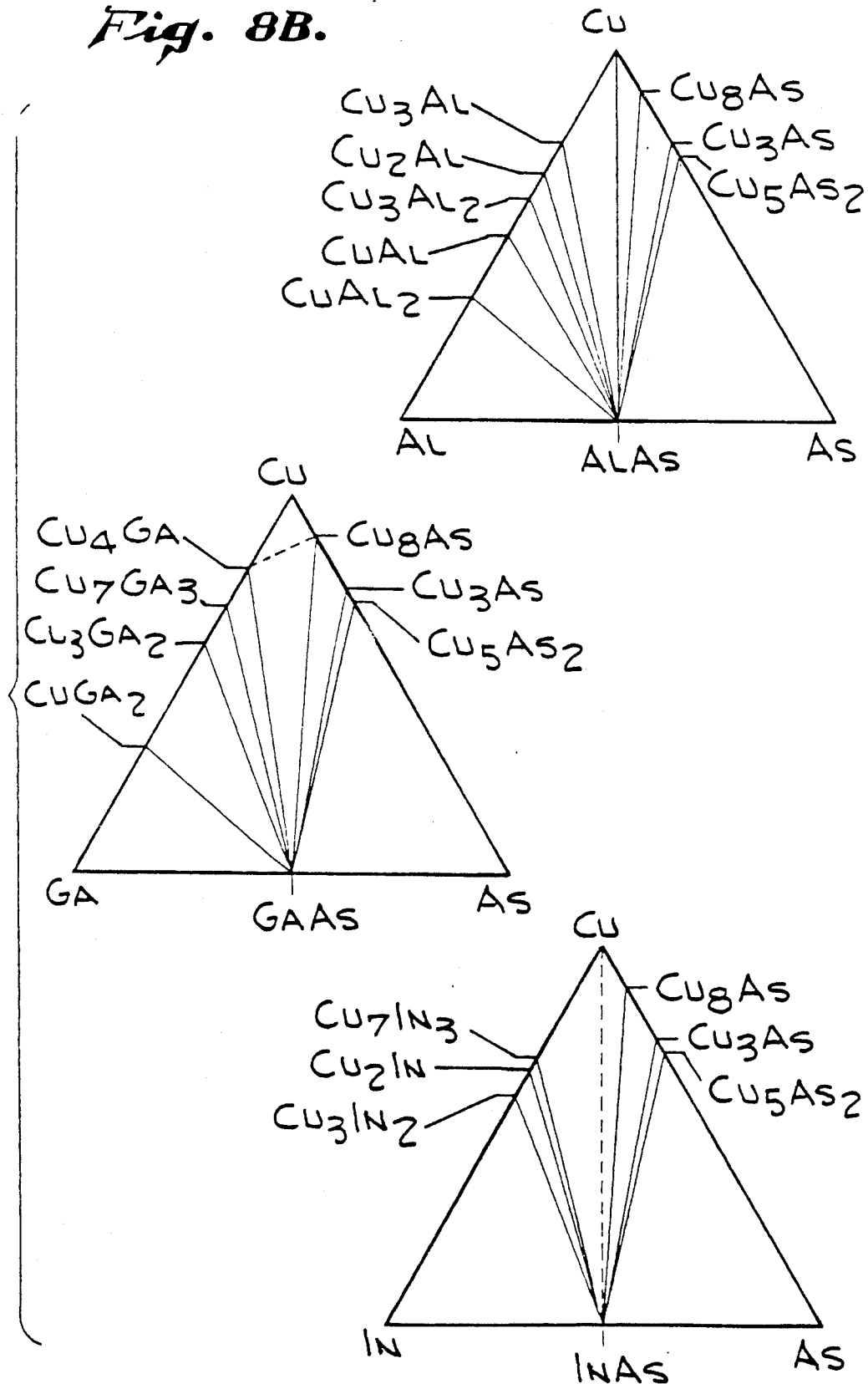
FIG. 8 are all ternary phase diagrams of the type Cu-III-V as utilized according to the present invention.

One example of a semiconductor/semiconductor system that has been used with limited success (but which is not a part of this invention) is a contact between Ge and GaAs. One method that has been effective in producing stable contacts to GaAs has been to grow a highly doped, epitaxial Ge layer on the GaAs substrate and then to form a contact on the Ge. The metal/semiconductor interface region may now be a binary system if a single element is used as the contacting metal. Thus, all the problems associated with forming multiphase metal contacts appear to have been avoided by interposing a layer of Ge between the GaAs and the metal. However, the Ge-GaAs interface still contains three elements. Examination of the bulk Ge-Ga-As phase diagram (FIG. 9) shows that Ge and GaAs form a pseudobinary in the ternary system. The two semiconductors behave just like two elemental species that form a simple eutectic system (although metastable solid solutions of Ge in GaAs may be formed and a limited exchange reaction is observed at Ge-GaAs interfaces). Thus, this contact metallization scheme is very stable and uniform because the bulk phases present at each interface in the multilayer structure are "locally" in thermodynamic equilibrium, as in the case of the multilayered oxides on GaAs, and each interface separates two materials that form pseudobinary or "true" binary systems. The key aspect to the formation of single-phase contacts to the compound semiconductors is thus to find pseudobinary tielines connecting the semiconductor to another phase, either an elemental semiconductor or the metallic phase itself.

The reasons for interest in intermetallic compounds forming pseudobinaries as contacts to compound semiconductors, as opposed to simply contacting an epitaxial semiconductor such as Ge on GaAs, are that (1) an elemental semiconductor that forms a pseudobinary with, and is lattice-matched to, the system of choice may not exist, and (2) some diffusion will occur between the two semiconductors to yield unwanted doping properties in either semiconductor material. Schottky barriers and Ohmic contacts derived from a single-phase intermetallic compounds that forms a pseudobinary system with a compound semiconductor will not react with the substrate and should thus yield a thermally stable and highly uniform conducting contact. Furthermore, these contacts should be temporally stable, and the number of defects created in the substrate material by chemical reactions with the film should be minimized. In fact, it has been observed that $AuGa_2$ films on Ga As retain their Schottky barrier even after annealing to 350 ° C, whereas Au Schottky barriers on GaAs degrade significantly and essentially become ohmic with equivalent annealing. The chemical stability of such conductor/compound-semiconductor systems Q will be especially useful in high-temperature and high-power devices, for which the primary limitation will be the eutectic temperature of the pseudobinary. The chemical and morphological uniformity achievable with a single-phase intermetallic compound film will also be useful in forming integrated circuits with compound-semiconductor materials that have smaller feature sizes and more reproducible characteristics than are presently achieved.

The deposition of conducting intermetallic compound films on compound-semiconductor substrates may best be accomplished by molecular-beam deposition, sputtering processes, or chemical vapor deposition of organometallic precursors in the primary growth chamber for the semiconductor material. This provides the highest degree of control over the stoichiometry of the conducting films, and also minimizes the contamination of the intermetallic compound/compound semiconductor interface. Only a few studies of the electrical characteristics of such contacts have been performed, but as noted above, the results have been very promising. Since the majority of Au-based contacts to III-V compound semiconductors actually involve an intermetallic compound formed during a chemical reaction with the substrate, the electrical properties of the pseudobinary contacts should be at least as good as existing contacts, as long as the substrate material can be properly doped.

It has been recognized in the past that element Ag is a unique chemically stable contact to GaAs, but the thermodynamic basis for this stability was not appreciated. This invention reveals how to obtain many more chemically stable conducting contacts for GaAs or any other compound semiconductor by choosing appropriate intermetallic compounds with insight gained from ternary phase diagrams. The chemically inert nature of epitaxial Ag layers on GaAs has already been reported, but in practical applications Ag may not be a suitable contact since it is readily attacked by oxidizing agents in the atmosphere. Several intermetallic compounds (i.e., $PtGa_2$, CoGa, NiGa) have much higher melting points and are more resistant to chemical attack, and are therefore to be preferred over Ag as a conducting contact.

Examples of lattice-matched pseudobinary systems involving intermetallic compounds also exist: $AuGa_2$ and GaSb terminate a pseudobinary cut through the Au-Ga-Sb ternary phase diagram. In addition, both compounds have cubic crystal structures ($AuGa_2$ has a fluorite lattice) with lattice constants within 0.5% of each other. Crystalline thin films of (001)-oriented $AuGa_2$ have been grown on GaSb(001) by MBE; this system is the compound semiconductor analogue of $NiSi_2$ on Si. The films are chemically stable on the compound-semiconductor material for annealing temperatures up to 480° C., and the substrates remain flat and free of etch pits. This behavior is in marked contrast to that observed for Au on GaSb, which reacts strongly to produce an extremely rough substrate morphology.

Even though the lattice mismatch is over 7%, epitaxial films of $AuGa_2$ have been grown on GaAs substrates by molecular beam epitaxy. These films were shown to be chemically inert, and did not react with the substrate even when they were heated above the melting temperature of $AuGa_2$. An even more promising metallization to GaAs is the intermetallic compound $PtGa_2$ which has a lattice mismatch of 4.4%. It also has a cubic flourite lattice, like $AuGa_2$, but it has a melting point in excess of 1000° C. $PtGa_2$ forms a pseudobinary cut with GaAs in the Pt-Ga-As ternary system, and epitaxial films of $PtGa_2$ have been grown on GaAs substrates using molecular beam epitaxy techniques. The intermetallic compound CoGa is almost perfectly lattice matched to GaAs, and single crystal films of this conductor have also been grown on GaAs by molecular beam epitaxy. A list of the presently known conducting intermetallic compounds in equilibrium with several compound semiconductors is shown in Table 1. Thus, there are many conductors that would make suitable contacts to compound semiconductors that are also chemically stable, but the utility of these intermetallic compounds was not realized before this invention was conceived.

TABLE 1

| | Compound Semiconductor | Pseudobinaries |
|---|---|---|
| III-V | AlP, AlAs, AlSb | $ScAl_2$, $TiAl$, $TiAl_3$, $VAl$, $CrAl_4$, $MnAl$, $FeAl_2$, $FeAl_3$, $CoAl$, $NiAl$, $NiAl_3$, $CuAl_2$, $YAl_2$, $ZrAl$, $ZrAl_2$, $ZrAl_3$, $Zr_2Al_3$, $MoAl_2$, $MoAl_3$, $RuAl$, $RuAl_2$, $RhAl$, $PdAl$, $Pd_2Al_3$, $PdAl_3$, $LaAl_3$, $HfAl_2$, $HfAl_3$, $TaAl_3$, $WAl_4$, $ReAl_2$, $OsAl_2$, $IrAl$, $Pt_2Al_3$, $PtAl_2$, $PtAl_3$, $AuAl$, $CeAl_2$, $CeAl_4$, $SmAl_2$, $SmAl_3$, $ThAl_2$, $YbAl_2$, $YbAl_3$ |
| | GaP, GaAs, GaSb | $Sc_5Ga_3$, $TiGa_2$, $TiGa_3$, $V_2Ga_5$, $CrGa$, $MnGa_3$, $FeGa_3$, $CoGa$, $CoGa_3$, $NiGa$, $Ni_2Ga_3$, $CuGa_2$, $YGa_2$, $ZrGa_3$, $Mo_3Ga$, $RuGa_3$, $RhGa_2$, $RhGa_3$, $PdGa$, $LaGa$, $LaGa_2$, $HfGa$, $HfGa_2$, $HfGa_3$, $TaGa_3$, $OsGa_2$, $IrGa_2$, $IrGa_3$, $PtGa$, $PtGa_2$, $Pt_2Ga_3$, $AuGa$, $AuGa_2$, $GdGa$, $GdGa_2$, $HoGa_2$, $PrGa_2$, $SmGa_2$, $TbGa_2$, $ThGa_2$, $CeGa_2$ |
| | InP, InAs, InSb | $Sc_5In_3$, $Ti_3In_4$, $CrIn_3$, $Mn_3In$, $CoIn$, $CoIn_2$, $NiIn$, $Ni_2In_3$, $Cu_2In$, $YIn_3$, $ZrIn_3$, $RuIn_2$, $RhIn$, $RhIn_3$, $PdIn$, $Pd_2In_3$, $PdIn_3$, $LaIn_3$, $Hf_3In_4$, $IrIn_3$, $PtIn_2$, $AuIn$, $AuIn_2$, $CeIn_3$, $NdIn_3$, $TbIn_3$, $Th_2In$, $YbIn_2$ |
| II-VI | ZnS | $Cu_2S$ |
| | ZnSe | $Cu_2Se$ |
| | CdS | $Ag_2S$ |
| IV-VI | SnSe | $Cu_2Se$, $Cu_2SnSe_3$ |
| | SnTe | $Ag_2Te$ |
| | | $AuSn$, $AuTe_2$ |
| | PbS | $Ag_2S$ |
| | PbSe | $Ag_2Se$ |
| | | $Ni_3Pb_2Se_2$ |
| | PbTe | $Ag_2Te$, $Ag_5Te_3$ |
| | | $AuTe_2$ |

In summary, the formation of conducting contacts on compound-semiconductor materials is an important technological problem. Whether or not chemical reactions will occur when a particular conducting is deposited in a compound-semiconductor substrate can be anticipated (or rationalized after the fact) by inspection of the appropriate ternary phase diagram. More important, the use of such phase diagrams to choose conducting intermetallic compounds that terminate pseudobinary tielines with the compound semiconductor of interest for use as contacts is significant. If the conducting contact chosen is an intermetallic compound, the contact will most likely have to be formed on the semiconductor substrate by directing stoichiometrically appropriate beams of the elements of the metal onto the substrate in a manner similar to MBE growth of semiconductor materials or by sputtering from an appropriate source material, or by a chemical vapor deposition approach. Such contacts will be in thermodynamic equilibrium with the semiconductor, except for any interfacial stresses or strains, and thus the chemical interactions across the conductor/semiconductor interface will be minimized. Table I presents a list of known pseudobinary intermetallic compound/compound-semiconductor systems for the III-V, II-VI, and IV-VI compound semiconductors.

The advantages of such contacts are that they will be comprised of a single phase, and thus will be morphologically and electrically uniform. Moreover, since they will not interact chemically with the substrate, they should be thermally and temporally very stable. Thus, these contacts fabricated from intermetallic compounds should be excellent candidates for defining very small features on compound semiconductors and for forming conductors for use in high-temperature environments. The uniformity and chemical stability should also make the electrical properties of these contacts highly reproducible and reliable. Furthermore, intermetallic compounds that terminate pseudobinary tielines with compound semiconductors may be found that can be grown epitaxially on the substrate material. This allows an extra kinetic stabilization of the conductor/compound-semiconductor interface, and may enable new types of structures to be fabricated.

The use of intermetallic-compound metal contacts on compound semiconductors will require a high degree of control over the doping of the semiconductor material in order to specify the electrical properties of these contacts. However, the potential gains to be achieved from the chemical stability of such systems in terms of device requirements suggests that effort expended in obtaining a particular electrical characteristic for a chemically stable conductor should pay dividends in terms of long-term device performance and reliability.

In the foregoing description of the present invention, one embodiment of the invention has been disclosed. It is to be understood that other varieties Q and enhancements of the present invention are within the scope of the invention. Accordingly, the present invention is not limited to the particular embodiment which has been discussed in detail herein.

What is claimed is:

1. A thermodynamically stable intermetallic-compound/compound semiconductor contact comprising
   a compound semiconductor substrate selected from the group consisting of AlP, AlAs, and AlSb; and
   a layer of an intermetallic compound formed on said substrate as determined by a pseudobinary tieline on a ternary phase diagram of the elements of said intermetallic compound and said compound semiconductor, said tieline extending between said compound semiconductor and said intermetallic compound and defining an interface behaving as a binary system, said intermetallic compound determined by said pseudobinary tieline being selected from the group consisting of $ScAl_2$, $TiAl$, $TiAl_3$, $VAl$, $CrAl_4$, $MnAl$, $FeAl_2$, $FeAl_3$, $CoAl$, $NiAl$, $NiAl_3$, $CuAl_2$, $YAl_2$, $ZrAl$, $ZrAl_2$, $ZrAl_3$, $Zr_2Al_3$, $MoAl_2$, $MoAl_3$, $RuAl$, $RuAl_2$, $RhAl$, $PdAl$, $Pd_2Al_3$, $PdAl_3$, $LaAl_2$, $HfAl_2$, $HfAl_3$, $TaAl_3$, $WAl_4$, $ReAl_2$, $OSAl_2$, $IrAl$, $Pt_2Al_3$, $PtAl_2$, $PtAl_3$, $AuAl$, $CeAl_2$, $CeAl_4$, $SmAl_2$, $SmAl_3$, $ThAl_2$, $YbAl_2$, $YbAl_3$.

2. A thermodynamically stable intermetallic-compound/compound semiconductor contact comprising
   a compound semiconductor substrate selected from the group consisting of GaP, GaAs, GaSb; and
   a layer of an intermetallic compound formed on said substrate as determined by a pseudobinary tieline on a ternary phase diagram of the elements of said intermetallic compound and said compound semiconductor, said tieline extending between said compound semiconductor and said intermetallic compound and defining an interface behaving as a binary system, said intermetallic compound determined by said pseudobinary tieline being selected from the group consisting of $Sc_5Ga_3$, $TiGa_2$, $TiGa_3$, $V_2Ga_5$, $CrGa$, $MnGa_3$, $FeGa_3$, $CoGa$, $CoGa_3$, $NiGa$, $Ni_2Ga_3$, $CuGa_2$, $YGa_2$, $ZrGa_3$, $Mo_3Ga$, $RuGa_3$, $RhGa_2$, $RhGa_3$, $PdGa$, $LaGa$, $LaGa_2$, $HfGa$, $HfGa_2$, $HfGa_3$, $TaGa_3$, $OsGa$, $IrGa_2$, $IrGa_3$, $PtGa$, $PtGa_2$, $Pt_2Ga_3$, $AuGa$, $GdGa$, $GdGa_2$, $HoGa_2$, $PrGa_2$, $SmGa_2$, $TbGa_2$, and $CeGa_2$.

3. A thermodynamically stable intermetallic-compound/compound semiconductor contact comprising
   a compound semiconductor substrate selected from the group consisting of InP, InAs, InSb; and
   a layer of an intermetallic compound formed on said substrate as determined by a pseudobinary tieline on a ternary phase diagram of the elements of said intermetallic compound and said compound semiconductor, said tieline extending between said compound semiconductor and said intermetallic compound and defining an interface behaving as a binary system, said intermetallic compound determined by said pseudobinary tieline being selected from the group consisting of $Sc_3In$, $Ti_3In_4$, $CrIn_3$, $Mn_3In$, $CoIn$, $CoIn_2$, $NiIn$, $Ni_2In_3$, $Cu_2In$, $YIn_3$, $Cu_2In$, $YIn_3$, $ZrIn_3$, $Mo$, $RuIn_3$, $RhIn$, $RhIn_3$, $PdIn$, $Pd_2In_3$, $PdIn_3$, $LaIn_3$, $Hf_3In_4$, $Ta$, $W$, $Re$, $Os$, $IrIn_3$, $PtIn_2$, $AuIn$, $AuIn_2$, $CeIn_3$, $NdIn_3$, $TbIn_3$, $Th_2In$, $YbIn_2$.

4. A thermodynamically stable intermetallic-compound/compound semiconductor contact wherein said compound semiconductor comprises GaAs; and
   a layer of an intermetallic compound formed on said substrate as determined by a pseudobinary tieline on a ternary phase diagram of the elements of said intermetallic compound and said compound semiconductor, said tieline extending between said compound semiconductor and said intermetallic compound and defining an interface behaving as a binary system, said intermetallic compound determined by said pseudobinary tieline comprises $PtGa_2$.

5. A thermodynamically stable intermetallic-compound/compound semiconductor contact wherein:
   said compound semiconductor comprises one of the group InAs or InSb; and
   a layer of an intermetallic compound formed on said substrate as determined by a pseudobinary tieline on a ternary phase diagram of the elements of said intermetallic compound and said compound semiconductor, said tieline extending between said compound semiconductor and said intermetallic compound and defining an interface behaving as a binary system, and said intermetallic compound determined by said pseudobinary tieline comprises $AuIn_2$.

* * * * *